US006400233B1

(12) United States Patent
Thomas

(10) Patent No.: US 6,400,233 B1
(45) Date of Patent: Jun. 4, 2002

(54) METHOD AND APPARATUS FOR COMPENSATING FOR DISTORTION IN IQ MODULATORS

(75) Inventor: Neil E. Thomas, Herts (GB)

(73) Assignee: IFR Limited, Stevenage (GB)

( * ) Notice: Subject to any disclaimer, the term of this patent is extended or adjusted under 35 U.S.C. 154(b) by 0 days.

(21) Appl. No.: 09/743,454

(22) PCT Filed: Jun. 25, 1999

(86) PCT No.: PCT/GB99/01996

§ 371 (c)(1),
(2), (4) Date: Jan. 10, 2001

(87) PCT Pub. No.: WO00/04634

PCT Pub. Date: Jan. 27, 2000

(30) Foreign Application Priority Data

Jul. 16, 1998 (GB) ............................................. 9815342

(51) Int. Cl.$^7$ ................................................. H03C 3/00
(52) U.S. Cl. ..................... 332/103; 375/296; 375/298; 329/304; 329/306
(58) Field of Search ......................... 332/103; 455/317; 375/296, 298; 329/304, 306

(56) References Cited

U.S. PATENT DOCUMENTS

| 4,053,837 A | * 10/1977 | Ryan et al. ..................... 333/18 |
| 5,111,155 A | 5/1992 | Keate et al. ................. 330/149 |
| 5,650,758 A | 7/1997 | Xu et al. |

FOREIGN PATENT DOCUMENTS

| EP | 0 725 477 | 8/1996 |
| EP | 0 881 807 | 12/1998 |
| GB | 2 247 797 | 3/1992 |
| WO | WO98/04034 | 1/1998 |

OTHER PUBLICATIONS

A.R. Mansell et al, "Transmitter Linearisation Using Composite Modulation Feedback" *Electronics Letters*, vol. 32, No. 23, Nov. 7, 1996.
Faulkner M et al.: "Correction of Mixer Nonlinearity in Quadrature Modulators" Electronics Letters, vol. 28, No. 3, (Jan. 1992), pp. 293–295.

* cited by examiner

*Primary Examiner*—Arnold Kinkead
(74) *Attorney, Agent, or Firm*—Nixon & Vanderhye P.C.

(57) ABSTRACT

A distortion compensating apparatus for use in IQ modulation and demodulation techniques wherein a first distortion arrangement distorts the I-signal by adding to the I-signal a first weighted function of the I-signal and a first weighted function of the Q-signal and a second distortion arrangement distorts for Q-signal by adding to the Q-signal a second weighted function of the I-signal and a second weighted function of the Q-signal, such that the weighted functions of the I-signal are independent of the Q-signal and the weighted functions of the Q-signal are independent of the I-signal. This enable distortions to be compensated in both sidebands of the IQ modulated signal.

22 Claims, 3 Drawing Sheets

METHOD AND APPARATUS FOR COMPENSATING FOR DISTORTION IN IQ MODULATORS

BACKGROUND OF THE INVENTION

1. Field of the Invention

The present invention relates to a method and apparatus for compensating for phase and amplitude distortion in an output signal generated when a complex signal is modulated onto a radio frequency carrier signal using IQ modulation techniques or when a complex signal is demodulated from a radio frequency carrier signal, again using IQ modulation techniques.

2. Discussion of Prior Art

The complex signal is broken up into its real part, the I-signal and an imaginary part, the Q-signal. The I-signal is amplitude modulated onto a local oscillator signal using a first double sideband mixer and the Q-signal is amplitude modulated onto a phase quadrature local oscillator signal (90° of phase with the local oscillator signal) using a second double sideband mixer. The outputs of the two double sideband mixers are then combined and the resultant modulated carrier signal carries the complex signal as amplitude and phase variations. The I and Q-signals can be recovered by demodulation in an IQ demodulation arrangement with respect to a local oscillator signal and a phase quadrature local oscillator signal respectively.

When a complex signal is modulated onto a carrier using an IQ modulator, the IQ modulator will behave substantially linearly when the input signal levels are low. As the level of the input signals increase an IQ modulator will become more non-linear and the output modulated carrier signal becomes distorted. Intermodulation distortion becomes a problem because some of the third order intermodulation products will have a frequency which is close to that of the desired signals and so are difficult to remove by filtering.

It is possible to operate an IQ mudulator by applying low enough level input signals such that the output signal can be modelled as the desired signal plus a small amount of third order distortion. Then a compensatory cubic distortion can be applied in order to improve the linearity of the output signal from the IQ modulator.

Cubic predistortion has been used in an IQ modulator by cubicly predistorting the complex signal. This is disclosed in the article entitled "Transmitter linearisation using composite modulation feedback" in Volume 32, Number 23 of Electronics Letters dated Nov. 7, 1996 in which the cubic predistortion is combined with a negative feedback loop. However, this cubic predistortion is of the opposite sign in upper and lower sidebands whereas the IQ modulator phase distortion is of the same sign in the upper and lower sidebands. This means that cancellation of distortion in both sidebands simultaneously is not possible.

SUMMARY OF THE INVENTION

The object of the present invention is to provide a distortion compensating arrangement for applications in which a complex signal is modulated onto a single carrier signal or in which a complex signal is recovered from a single carrier signal, using IQ mudulation techniques and which overcomes the problems discussed above.

According to the present invention there is provided distortion compensating apparatus for use in IQ modulation and demodulaton techniques wherein a first distortion arrangement distorts the I-signal by adding to the I-signal a first weighted function of the I-signal and a first weighted function of the Q signal and a second distortion arrangement distorts the Q-signal by adding to the Q-signal a second weighted function of the I-signal and a second weighted function of the Q-signal, such that the weighted functions of the I-signal are independent of the Q-signal and the weighted functions of the Q-signal are independent of the I-signal. In the prior art any distortion for improving linearity has distorted both components of the complex signal identically, whereas according to the present invention the distortion takes place on the I and Q components independently. This makes it possible to compensate for distortion in both sidebands simultaneously.

According to a preferred embodiment of the present invention the distortion compensating apparatus, comprises;
a first operator arrangement for generating a function of the I-signal,
a second operator arrangement for generating a function of the Q-signal, and
signal processing means for performing a weighted summation of the I-signal, the function of the I-signal and the function of the Q-signal to generate a distortion compensated I-signal output, and for performing a weighted summation of the Q-signal, the function of the Q-signal and the function of the I-signal to generate a distortion compensated Q-signal output.

By taking the I and Q signals which are to be amplitude modulated onto a single carrier signal by an IQ mudulator, and predistorting the I-signal by adding an appropriately weighted amount of a function of the I-signal and a function of the Q-signal and also predistorting the Q-signal by adding an appropriately weighted amount of a function of the I-signal and a function of the Q-signal, distortion can be substantially eliminated in both the upper and lower sidebands of the modulated carrier signal output from the IQ modulator.

Preferably the function is a polynomial and preferably the polynomial is cubic. Cubic distortion is the dominant type of distortion for most components and so a compensating cubic polynomial is preferred.

However, particularly in analogue processing, approximations to a cubic distortion, which effectively applies an approximation to a cubic polynomial to the I and Q-signals, may be simpler to implement. In certain cases higher order polynomials may be appropriate to provide distortion compensation.

The apparatus according to the present invention can be used to predistort I and Q-signals which are to be input into an IQ modulator or to post distort I and Q-signals which have been recovered from an IQ demodulator.

It is preferred that least one multiplier is used to multiply the functions of the I and Q-signals by a weighting factor. This provides the weighting ready for the subsequent summation. Then, it is preferred that at least one adder adds selected outputs of the one or more multipliers in order to perform the weighted summations.

In a preferred embodiment a first multiplier multiplies the function of the I-signal with a first weighting factor and a second multiplier multiplies the function of the Q-signal with a second weighting factor and an adder adds the output from the first multiplier and the second multiplier to the I-signal. In a preferred embodiment, a third multiplier multiplies the function of the I-signal with a third weighting factor and a fourth multiplier multiplies the function of the Q-signal with a fourth weighting factor and an adder adds the output from the third multiplier and the fourth multiplier to the Q-signal.

At least one of the multipliers may be implemented as a look up table and at least one of the operator arrangements can be implemented as a look up table in order to efficiently implement the circuitry required to perform the weighted summation.

According to a second aspect of the present invention there is provided a device for adjusting a composite IQ modulator or demodulator, which composite IQ modulator or demodulator comprises a distortion compensating apparatus as described above and an IQ modulator or demodulator.

The adjusting device comprises a signal source for generating test signals, a spectrum analyzer for measuring the level of distortion in the output of the IQ modulator or demodulator under test and a control processor for controlling the weighting factors. In this way the weighting factors can be varied until the distortion level is minimised.

According to a third aspect of the present invention there is provided a method for improving linearity in IQ modulation and demodulation techniques wherein the I-signal is distorted by adding to the I-signal a first weighted function of the I-signal and a first weighted function of the Q-signal and the Q-signal is distorted by adding to the Q-signal a second weighted function of the I-signal and a second weighted function of the Q-signal, such that the function of the I-signal is independent of the Q-signal and the function of the Q-signal is independent of the I-signal.

In a preferred embodiment the method comprises;
generating a function of the I-signal,
generating a function of the Q-signal,
performing a weighted summation of the I-signal, the function of the I-signal and the function of the Q-signal to generate a distortion compensated I-signal output,
and performing a weighted summation of the Q-signal, the function of the Q-signal and the function of the I-signal to generate a distortion compensated Q-signal output.

Preferably the function is a polynomial and preferably the polynomial is cubic. According to a preferred embodiment of the method at least one of the functions of the signals is multiplied by one or more weighting factors. Thereafter selected multiplied functions of the signals can be added to perform the weighted summation.

It will be apparent that the distortion compensation according to the present invention can be carried out by digital or analogue processing of the I and Q-signals or by a combination of digital and analogue processing stages.

BRIEF DESCRIPTION OF THE DRAWINGS

In order that the present invention is more fully understood and to show how the same may be carried into effect, reference shall now be made to the Figures shown in the accompanying drawings, wherein.

DETAILED DISCUSSION OF EMBODIMENTS

Figure 1:
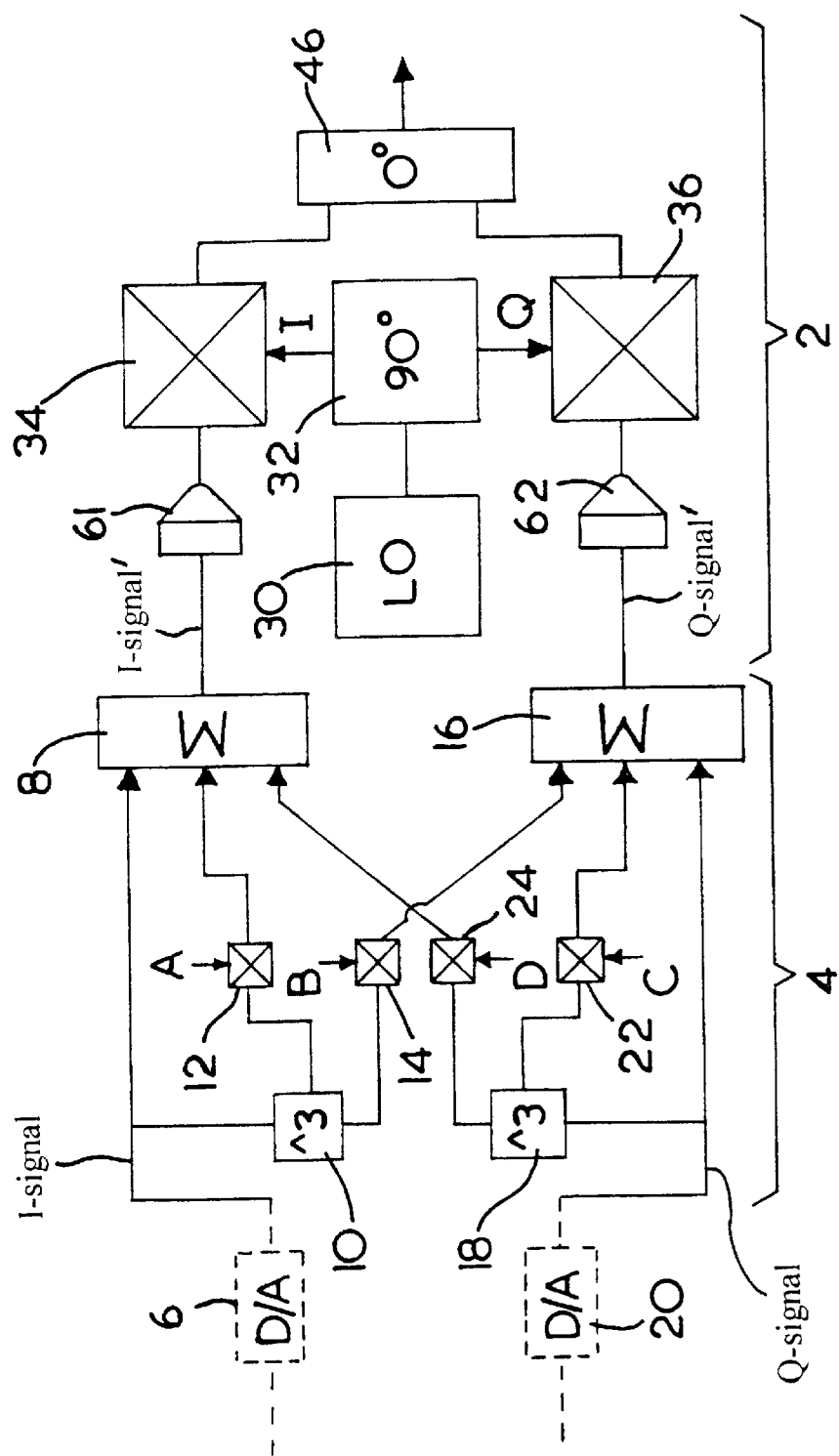
FIG. 1 shows a schematic representation of a distortion compensation arrangement according to the present invention arranged to predistort the I and Q signals which are to be IQ modulated onto a radio frequency carrier signal using an IQ modulator.

Referring firstly to FIG. 1, which shows a distortion arrangement (4) arranged to predistort the I and Q-signals before they are input into the I and Q arms respectively of an IQ modulator (2). The I and Q-signals are generated digitally.

In FIG. 1 the predistortion is effected by digital processing stages and so the signals remain in digital form and are converted to analogue form before being input into the IQ modulator (2) by digital to analogue convertors or DACs (61) and (62).

The distortion arrangement (4) according to the present invention is used to predistort the I and Q-signals to compensate for third order distortion in the output modulated carrier signal.

The I-signal is input directly into a first adder (8) and is also input into a first cubing block (10) to generate a signal (I-signal)$^3$=I-signal.modsq(I-signal)

where modsq(I-signal)=I-signal.complex conjugate(I-signal).

A constant weighting factor A is then applied to the signal (I-signal)$^3$ at multiplier (12) and the resulting signal A.(I-signal)$^3$ is input into the first adder (8). A constant weighting factor B is applied to the signal (I-signal)$^3$ at multiplier (14) and the resulting signal B.(I-signal)$^3$ is input into a second adder (16).

Similarly, the Q-signal is input directly into the second adder (16) and is also input into second cubing block (18) to generate a signal (Q-signal)$^3$=Q-signal modsq(Q-signal)

where modsq(Q-signal)=Q-signal complex conjugate(Q-signal).

A constant weighting factor C is then applied to the signal (Q-signal)$^3$ at multiplier (22) and the resulting signal C.(Q-signal)$^3$ is input into the second adder (16). A constant weighting factor D is applied to the signal (Q-signal)$^3$ at multiplier (24) and the resulting signal D.(Q-signal)$^3$ is input into the first adder (8).

Therefore, signals I-signal, A.(I-signal)$^3$ and D.(Q-signal)$^3$ are input into the first adder (8) and signals Q-signal, C.(Q-signal)3 and B.(I-signal)$^3$ are input into the second adder (16).

The resultant signal from the first adder (8) is therefore $$I\text{-signal}'=I\text{-signal}+A.(I\text{-signal})^3+D.(Q\text{-signal})^3$$

and forms the predistorted I-signal (I-signal') which is input into the in-phase arm of IQ modulator (2).

The resultant signal from the second adder (16) is $$Q\text{-signal}'=Q\text{-signal}+C.(Q\text{-signal})^3+B.(I\text{-signal})^3$$

and forms the predistorted Q-signal (Q-signal') which is input into the in-quadrature arm of the IQ modulator (2).

Because the weighting factors A, B, C and D are generally constant and will generally be small, the multipliers (12, 14, 22 and 24) can be implemented efficiently as look-up tables. Also because the correction factors are small, few significant bits are required in the cubing operation performed by the cubing blocks (10, 18). This considerably simplifies the implementation of the cubing operation. As the output of each cubing block (10, 18) is the function of a single variable, the cubing block can also be implemented as a look-up table.

If the predistortion is to be effected by analogue processing stages then the digital I and Q-signals are converted to analogue form by digital to analogue converters (DACs) (6) and (20) respectively (shown in dotted lines in FIG. 1) and DACs (61,62) would not be required. In the analogue domain non-linear elements can create a cubic function, or an approximation thereto which would replace cubing blocks (10, 18). The weighting would then be controlled by controllable amplifiers or attenuators which would replace multipliers (12, 14, 22, 24).

The IQ modulator (2) comprises radio frequency local oscillator (30) which generates a signal of, for example, 4 GHz which is input into a 90° hybrid (32) which supplies the in-phase or I local oscillator signal to double sideband mixer (34) and the in-quadrature or Q local oscillator signal to double sideband mixer (36). The predistorted I-signal (I-signal') from the first adder (8) is modulated onto the I local oscillator signal at mixer (34) and the predistorted Q-signal (Q-signal') from the second adder (16) is modulated onto the Q local oscillator signal at mixer (36). These are then added in the combiner (46).

By using the distortion arrangement (4) to predistort the I and Q-signals which are input into the IQ mudulator (2) the third order distortion in the modulated carrier signal output from the IQ modulator can be effectively suppressed. This is provided that the double sideband mixers (34) and (36) in the IQ-modulator (2) are working with sufficiently low signal levels that fifth and higher order distortion can be ignored.

The values of A, B, C and D in the distortion arrangement (4) have to be determined for the particular IQ modulator (2) for which the arrangement (4) is intended, because each design of IQ modulator will apply different levels of third order distortion as it processes the input signals.

Figure 2:
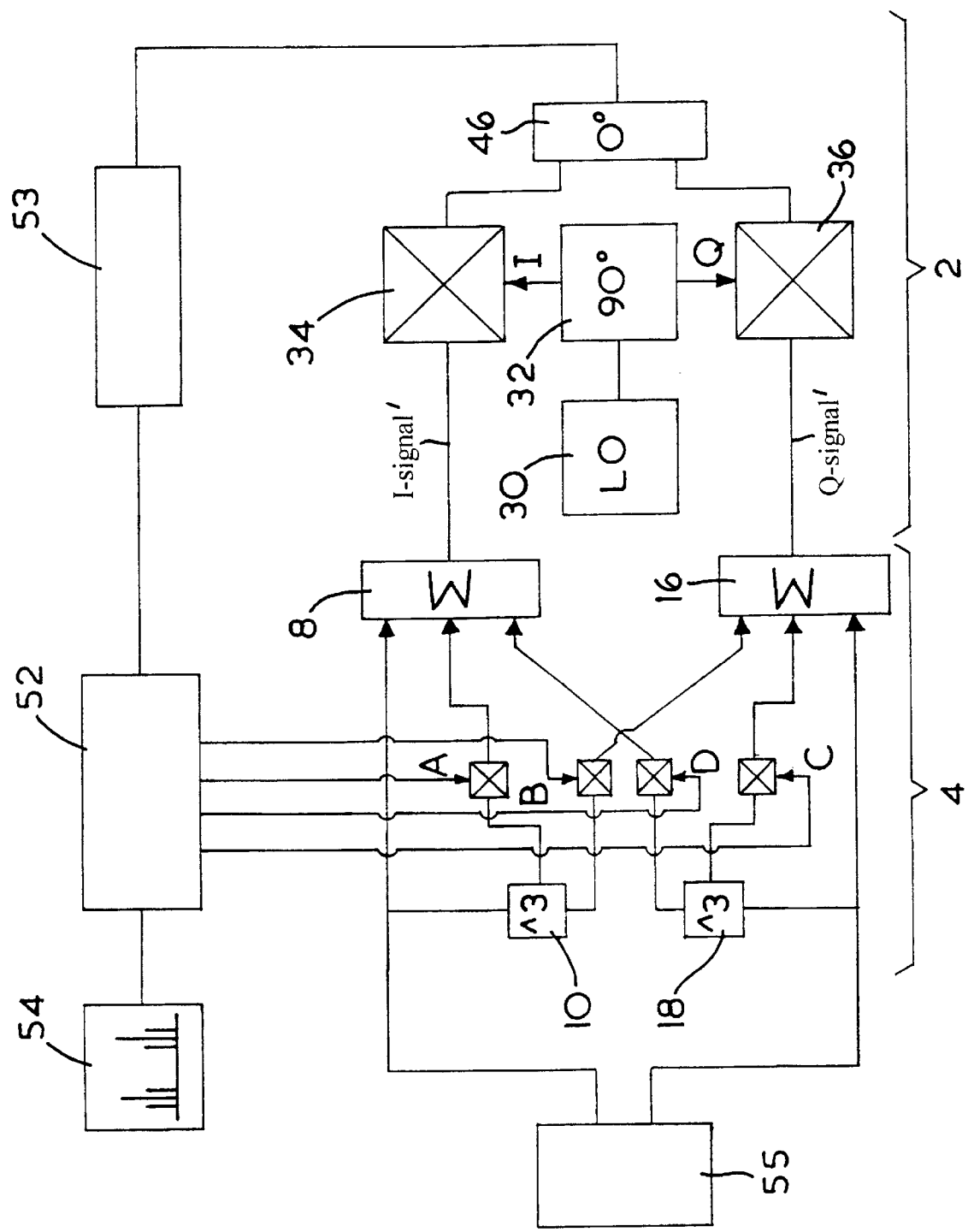
FIG. 2 shows a schematic representation of adjustment or callibration equipment for an IQ modulator incorporating the distortion compensation arrangement of FIG. 1.

FIG. 2 shows equipment suitable for adjusting a composite device comprising the distortion arrangement (4) and an IQ modulator, such as the IQ modulator (2) shown in FIG. 1. The test equipment comprises a distortion arrangement (4) as described above in relation for FIG. 1, a signal source (55), a control processor (52), a spectrum analyser (53) and optionally a display (54).

The signal source (55) generates suitable IQ test signals which would include a single complex tone, where the spectrum analyser looks for harmonic distortion, and a pair of complex tones, where the spectrum analyser would look for intermodulation distortion between the two tones.

The I and Q-signals are input into the distortion arrangement (4) and predistorted as described above in relation to FIG. 1. The predistorted signals I-signal'and Q-signal'are then input into the respective inputs of the IQ modulator (2). The IQ modulator (2) modulates the I and Q-signals onto a single carrier and the modulated output of the IQ modulator (2) is input into the spectrum analyser (53). The spectrum analyser is arranged to measure the level of third order distortion in the signal output from the IQ modulator (2). The control processor (52) in response to the output from the spectrum analyser (53) generates and controls the weighting factor signals A, B, C and D which provide the weighting in the summation performed by the distortion arrangement (4). The control processor (52) is arranged to systematically alter the signals A, B, C and D until the distortion products measured by the spectrum analyser (53) are minimised. The values of A, B, C and D which achieve the maximum reduction of distortion products are then the optimum levels which can be fixed for commercially manufactured implementations of the distortion arrangement (4) adapted to the IQ modulator (2).

Of course, the optimisation of A, B, C and D can also be done by an individual observing the screen (54) and manually altering the levels of A, B, C and D input into the distortion arrangement (4) by the control processor (52).

Figure 3:
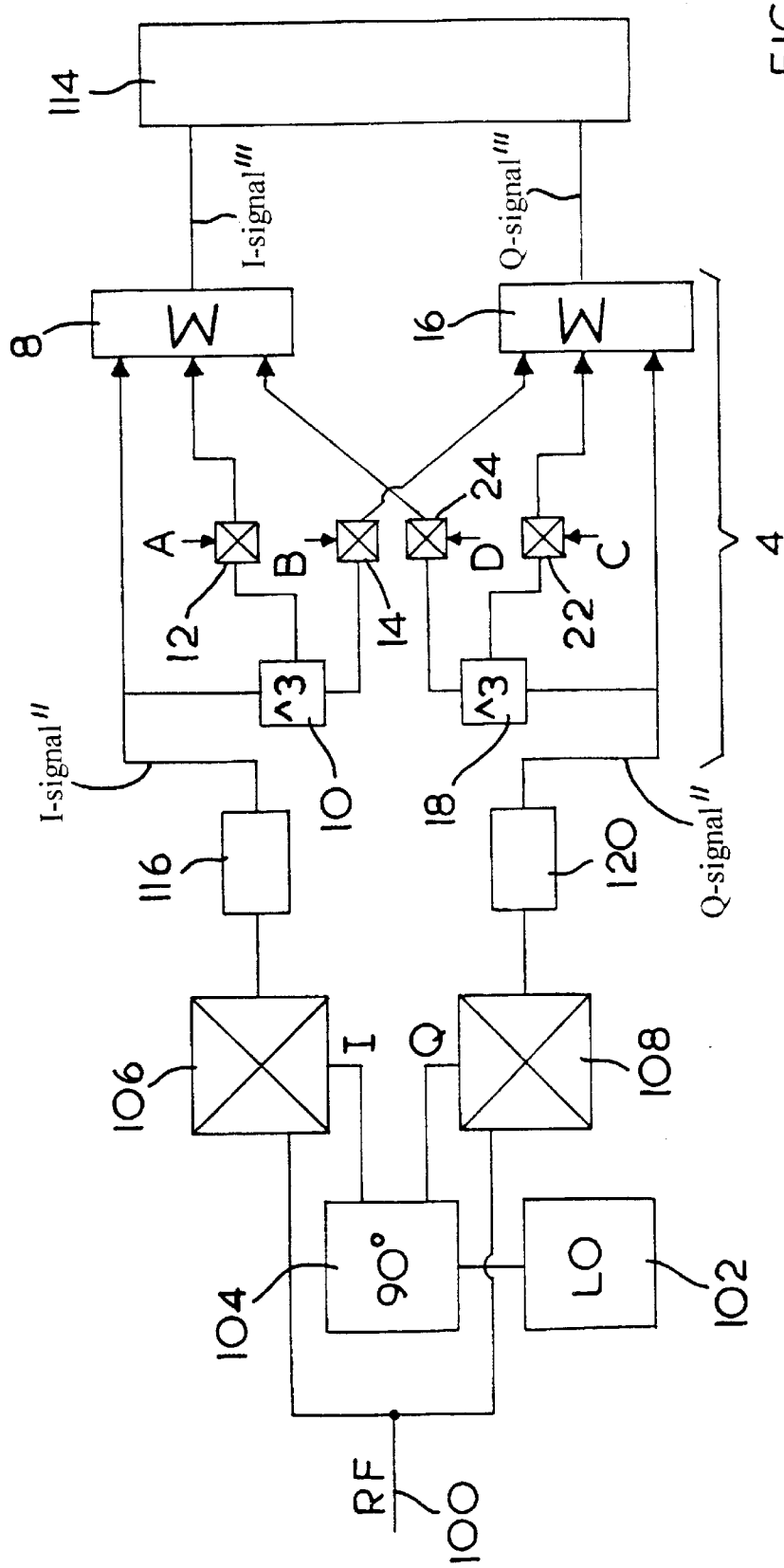
FIG. 3 shows a schematic representation of a distortion arrangement according to the present invention arranged to postdistort the I and Q-signals which have been demodulated from a single radio frequency carrier signal by an IQ demodulation arrangement with respect to a local oscillator signal and a phase quadrature local oscillator signal.

FIG. 3 shows the distortion arrangement (4) being used to post distort the I and Q-signals recovered from a radio frequency carrier which has undergone demodulation in an IQ demodulation arrangement. The radio frequency carrier is input at (100). The carrier, prior to its broadcast, was modulated with I and Q-signals by the IQ modulator (2) shown in FIG. 2. A local oscillator (102) generates the reference radio frequency signal of 4 GHz and a 90° hybrid (104) generates the local oscillator signal I and the phase quadrature local oscillator signal Q. Double sideband mixer (106) then mixes the carrier signal with the local oscillator signal and the resultant signal is passed through low pass filter (116) to recover the demodulated I-signal". Double sideband mixer (108) mixes the carrier signal with the phase quadrature local oscillator signal and the resultant signal is passed through low pass filter (120) to recover demodulated signal Q-signal". Clearly, I-signal" and Q-signal" will have phase and amplitude distortions applied to them already by the mixing stage of the demodulation process and so the compensatory distortion applied by the arrangement (4) will be less effective to reduce intermodulation distortion than when the undistorted signals I-signal and Q-signal are input into the arrangement (4) as described above in relation to FIG. 1. The signals I-signal" and Q-signal" are processed by the distortion arrangement (4) as described above in relation to FIG. 1. The post distorted signal I-signal'" and Q-signal'" are input into signal processor (114) for further processing.

By passing the recovered I and Q-signals through the distortion arrangement (4), distortion products will be suppresed.

What is claimed is:

1. A distortion compensating apparatus for use in IQ modulation and demodulation techniques wherein a first distortion arrangement distorts an I-signal by adding to the I-signal a first weighted non-linear function of the I-signal and a first weighted non-linear function of a Q-signal and a second distortion arrangement distorts the Q-signal by adding to the Q-signal a second weighted non-linear function of the I-signal and a second weighted non-linear function of the Q-signal, such that the weighted non-linear functions of the I-signal are independent of the Q-signal and the weighted non-linear functions of the Q-signal are independent of the I-signal.

2. An apparatus according to claim 1, comprising;
   a first operator arrangement for creating a function of the I-signal,
   a second operator arrangement for creating a function of the Q-signal, and,
   signal processing means for performing a weighted summation of the I-signal, the function of the I-signal and the function of the Q-signal to generate a distortion compensated I-signal output, and for performing a weighted summation of the Q-signal, the function of the Q-signal and the function of the I-signal to generate a distortion compensated Q-signal output.

3. An apparatus according to claim 1 wherein the function is a polynomial.

4. An apparatus according to claim 3 wherein the polynomial is cubic.

5. An apparatus according to claim 1 wherein the distorted I and Q-signals are amplitude modulated onto a single carrier signal by an IQ modulator.

6. An apparatus according to claim 1 wherein the I and Q-signals are demodulated from a single carrier signal by an IQ demodulation arrangement.

7. An apparatus according to claim 1 wherein at least one multiplier is used to multiply the function of the I and Q-signals by a weighting factor.

8. An apparatus according to claim 7 wherein at least one adder adds selected outputs of the one or more multipliers in order to perform weighted summations.

9. An apparatus according to claim 1 wherein a first multiplier multiplies the function of the I-signal with a first constant weighting factor and a second multiplier multiplies the function of the Q-signal with a second constant weighting factor.

10. An apparatus according to claim 9 wherein a third multiplier multiplies the function of the Q-signal with a third constant weighting factor and a fourth multiplier multiplies the function of the I-signal with a fourth constant weighting factor.

11. An apparatus according to claim 9 wherein, an adder adds the output from the first multiplier and the second multiplier to the I-signal.

12. An apparatus according to claim 10 wherein an adder adds the output from the multiplier and the fourth multiplier to the Q-signal.

13. An apparatus according to claim 7 wherein said at least one of the multipliers is implemented as a look up table.

14. An apparatus according to claim 2 wherein at least one of the operator arrangements is implemented as a look up table.

15. A method for improving linearity in IQ modulation and demodulation techniques comprising steps wherein an I-signal is distorted by adding to the I-signal a first weighted non-linear function of the I-signal and a first weighted non-linear function of a Q-signal and the Q-signal is distorted by adding to the Q-signal a second weighted non-linear function of the I-signal and a second weighted non-linear function of the Q-signal, such that the weighted functions of the I-signal are independent of the Q-signal and the weighted functions of the Q-signal are independent of the I-signal.

16. A method according claim 15, further comprising steps of;

generating a function of the I-signal, generating a function of the Q-signal, performing a weighted summation of the I-signal, the function of the I-signal and the function of the Q-signal to generate a distortion compensated I-signal output, and performing a weighted summation of the Q-signal, the function of the Q-signal and the function of the I-signal to generate a distortion compensated Q-signal output.

17. A method according to claim 15 wherein the function is a polynomial.

18. A method according to claim 17 wherein the polynomial is cubic.

19. A method according to claim 15 wherein at least one of the function of the I,Q signals is multiplied by one or more weighting factors.

20. A method according to claim 19 wherein selected multiplied functions of the I,Q signals are added to perform the weighted summation.

21. A device for adjusting a composite IQ modulator or demodulator which composite IQ modulator or demodulator comprises a distortion compensating apparatus according to claim 1 and an IQ modulator or demodulator, which device comprises;

a spectrum analyser for measuring the level of distortion in the output of a composite IQ modulator or demodulator; and a control processor for controlling the weighting of the functions of the I and Q-signals in a composite IQ modulator or demodulator.

22. A device according to claim 21 which includes a signal source for generating test signals.

* * * * *